United States Patent [19]
Ra

[11] Patent Number: 6,038,175
[45] Date of Patent: Mar. 14, 2000

[54] ERASE VERIFYING APPARATUS IN SERIAL FLASH MEMORY HAVING REDUNDANCY AND METHOD THEREOF

[75] Inventor: Kyeong-Man Ra, Cheongju, Rep. of Korea

[73] Assignee: LG Semicon Co., Ltd., Cheongju, Rep. of Korea

[21] Appl. No.: 09/251,322

[22] Filed: Feb. 17, 1999

[30] Foreign Application Priority Data

Oct. 29, 1998 [KR] Rep. of Korea ............... 98 45909

[51] Int. Cl.[7] ........................... G11C 29/00
[52] U.S. Cl. ................. 365/185.29; 365/185.22
[58] Field of Search .............. 365/185.29, 185.22, 365/185.09, 200

[56] References Cited

U.S. PATENT DOCUMENTS

| | | | |
|---|---|---|---|
| 4,701,887 | 10/1987 | Ogawa | 365/200 |
| 5,347,484 | 9/1994 | Kwong et al. | 365/49 |
| 5,438,546 | 8/1995 | Ishac et al. | 365/200 |
| 5,617,359 | 4/1997 | Ninomiya | 365/185.29 |
| 5,621,687 | 4/1997 | Doller | 365/185.22 |
| 5,784,316 | 7/1998 | Hirata | 365/185.29 |

*Primary Examiner*—Tan T. Nguyen
*Attorney, Agent, or Firm*—Fleshner & Kim

[57] ABSTRACT

An erase verifying apparatus includes: a memory cell array including a plurality of main areas and redundant areas having one or more cells, the main areas and redundant areas forming an erase block, a wordline circuit for controlling wordlines in the memory cell array, a redundancy control unit for storing redundancy information, a data buffer for loading replacement information from the redundancy control unit, a column selector for selecting a column in the memory cell array, a sense amplifier for sensing an output from the selected cell, and a controller for controlling all operations, and an erase verifying method includes the steps of: initializing the data buffer, loading the redundancy information stored in the redundancy control unit to the data buffer, selecting a certain erase block and erasing the cell data of the selected erase block by using the wordline circuit, selecting the cells of the selected erase block sequentially, checking whether the cell of the data buffer corresponding to the selected cell is replaced by the redundancy, and checking the output from the sense amplifier when the cell of the data buffer is not replaced by the redundancy.

20 Claims, 2 Drawing Sheets

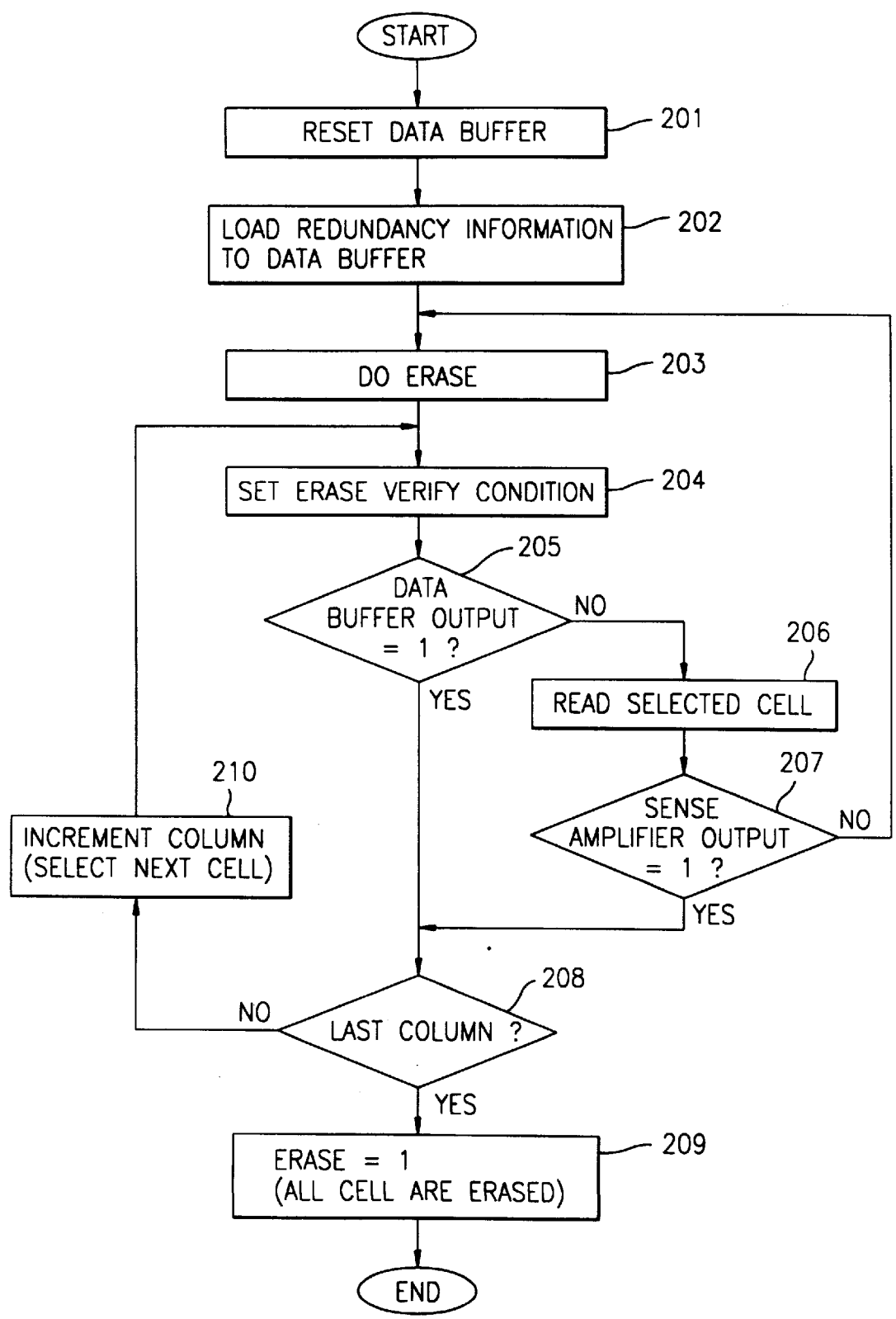

ERASE VERIFYING APPARATUS IN SERIAL FLASH MEMORY HAVING REDUNDANCY AND METHOD THEREOF

BACKGROUND OF THE INVENTION

1. Field of the Invention

The present invention is directed to a redundancy structure of a flash memory, and in particular to an erase verifying apparatus in a serial flash memory having a column redundancy, and a method thereof.

2. Description of the Background Art

As the present invention relates to a project in progress, there is no referential one among the conventional flash memory-related arts which have been manufactured or registered. Especially, a serial access flash memory employing an NOR type array and a column redundancy has not been disclosed.

Currently, among the flash memories, only a random access flash memory using an NOR type array structure, a cell array and an input/output buffer being directly connected(a data buffer is not used for connection), such as Intel and AMD, employs a column redundancy. According to the U.S. Pat. No. 4,701,887, it is disclosed a memory-related technique (Video RAM) carrying out a serial access by using the data buffer and employing the column redundancy. However, an erase verifying operation is not described therein.

According to the U.S. Pat. Nos. 5,347,484 and 5,438,546, it is disclosed a replacement method of the column redundancy in the random access flash memory which does not include the data buffer. The above patents use a hardware method directly transferring replacement information to each sense amplifier or multiplexer through a wire.

The hardware method can also be utilized in the random access flash memory which includes the data buffer. Here, as a number of the sense amplifiers or a volume of redundancy (a number of the redundancies to be replaced) is increased, a circuit is more complicated, that is a problem may occur in interconnection.

In the random access memory RAM, a number of the sense amplifiers is generally identical to a number of input/output I/O lines (×8, 8 and ×16, 16). However, in the case of the serial flash memory, at least 64 to 128 or 256 sense amplifiers are required, or sense amplifiers as many as the columns (2048 or 4096) are necessary for system performance. Accordingly, it is impossible to employ the hardware method transferring the redundancy information to the plurality of sense amplifiers via the wire.

In the Nor type serial flash memory in which the data buffer is positioned between the cell array and I/O buffer, a cell data is not accessed directly from an external space but accessed through the data buffer. A specific column in a main cell array is replaced by the redundancy column. When the column is completely replaced, a cell is erased and an erase verifying operation is carried out.

According to the conventional erase verifying method, the erase verifying operation can be exactly performed when the information (current flow) that a current column is replaced by the redundancy column is transferred to the sense amplifier. However, the conventional erase verifying method has a disadvantage as follows.

It is presumed that, a cell is in an erase state when a current flows in the cell (data "1"), and the cell is in a program state when the current does not flow in the cell (data "0"). When the current column is replaced by the redundancy, an output of the sense amplifier always displays the program state of the cell (namely the current does not flow in the cell) regardless of the cell state during the erase verifying operation, and thus it cannot be informed of whether the cells are exactly erased. Here, the current column is replaced by the redundancy and not employed, As a result, the output from the sense amplifier is useless information. Accordingly, the erase verifying operation cannot be exactly carried out merely with the output from the sense amplifier.

Thus, in order to ignore the output from the sense amplifier and regard the current cell as being erased, the information that the currently-verified cell is replaced by the redundancy should be transferred to the sense amplifier or an external erase verifying apparatus. As described above, the replacement information can be transferred to all the sense amplifiers through the wire according to the hardware method. However, in case the sense amplifiers are increased more than a predetermined number, the hardware method itself cannot be employed. As a result, it is impossible to transfer the replacement information.

SUMMARY OF THE INVENTION

It is therefore a primary object of the present invention to provide an erase verifying apparatus in a serial flash memory capable of preventing an erase verifying error by a redundancy from occurring, and a method thereof.

It is another object of the present invention to provide an erase verifying apparatus in a serial flash memory capable of processing redundancy replacement information by a data buffer according to a software method, and a method thereof.

It is still another object of the present invention to provide an erase verifying apparatus in a serial flash memory capable of carrying out an erase verifying operation by using a minimum hardware regardless of a number of sense amplifiers or a volume of redundancy, and a method thereof.

In order to achieve the above-described objects of the present invention, there is provided an erase verifying apparatus including: a memory cell array having a plurality of main areas and redundant areas consisting of one or more cells, the main areas and redundant areas forming an erase block; a wordline circuit selecting a wordline in the memory cell array under a control of a controller during an erase verifying operation; a redundancy control unit storing redundancy information; a data buffer loading the redundancy information from the redundancy control unit; a column selector selecting a column from the memory cell array; a sense amplifier sensing an output from the cell selected by the wordline circuit and column selector; and a controller controlling all operations and performing the erase verifying operation.

In addition, in order to achieve the above-described objects of the present invention, there is provided an erase verifying method including: initializing the data buffer; loading the redundancy information stored in the redundancy control unit to the data buffer; selecting a certain erase block from the memory cell array and erasing the cell of the selected erase block; applying an erase verifying voltage to the wordline of the erase block, and selecting the cell from the erase block by sequentially designating the columns; determining the erase of the cell by checking whether a cell of the data buffer positioned identically to the selected cell is replaced by the redundancy; and determining the erase of the cell by checking an output from the sense amplifier when the cell of the data buffer is not replaced by the redundancy.

BRIEF DESCRIPTION OF THE DRAWINGS

The present invention will become better understood with reference to the accompanying drawings which are given only by way of illustration and thus are not limitative of the present invention, wherein:

FIG. 2 is a flowchart of an erase verifying operation in the serial flash memory in FIG. 1.

DETAILED DESCRIPTION OF THE INVENTION

Figure 1:
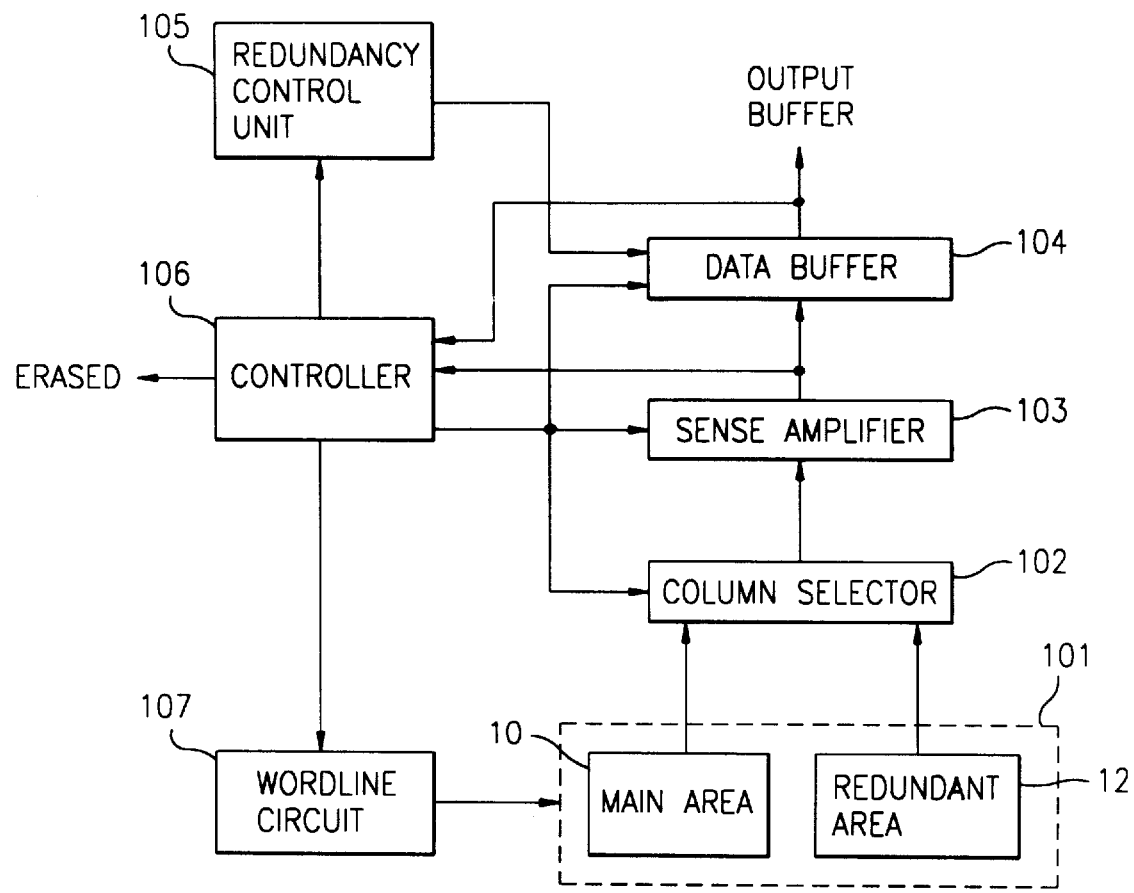
FIG. 1 is a block diagram illustrating an erase verifying apparatus in a serial flash memory according to the present invention.

FIG. 1 is a block diagram illustrating an erase verifying apparatus in a serial flash memory according to the present invention.

The erase verifying apparatus includes: a memory cell array 101; a column selector 102 sequentially selecting a plurality of columns; a sense amplifier 103; a data buffer 104 loading redundancy information; a redundancy control unit 105 storing the redundancy information; a controller 106; and a wordline circuit 107.

The memory cell array 101 is an NOR type flash memory cell array including a main area 10 and a redundant area 12. The redundant area 12 is used to replace a defective cell in the main area 10. A redundant memory cell is also positioned at a cross point of the column and row. Accordingly, when a defect occurs in the memory cell in the column of the main area 10, the defective column in the main area 10 is replaced by a redundant column in the redundant area 12. Here, a column address of the main area 10 replaced by the redundancy is stored in the redundancy control unit 105 as the redundancy information.

The memory cell array 101 includes a plurality of main blocks. The redundant area 12 has a plurality of redundant blocks corresponding respectively to the plurality of main blocks. Here, the erase block includes the main blocks and redundant blocks. The main blocks and redundant blocks are simultaneously erased.

The data buffer 104 consists of a SRAM (static RAM) or a register, and stores the replacement information of the cell based on the redundancy information which is stored in the redundancy control unit 105. The SRAM cell of the data buffer 104 is positioned identically to the cell of the memory cell array 101. The redundancy control unit 105 provides the replaced column address (redundancy information) to the data buffer 104, and controls all the redundancies. The wordline circuit 107 selects the erase block (main block+ redundant block) and applies an erase pulse to the selected erase block. The wordline circuit 107 applies a predetermined wordline voltage (erase verifying voltage) to the selected erase block during the erase verifying operation.

The operation of the erase verifying apparatus according to the present invention will now be described with reference to the accompanying drawings.

(1) Erase Operation

First, the controller 106 resets the data buffer 104 to an initial state(201).

The initial state may be set to be "0" or "1". If the state is wrongly designated, an internal logic operation in the controller 106 may be changed.

Here, it is presumed that the initial state is set to be "0" and that the data buffer 104 consists of the SRAM for convenience. In addition, a state that a current flows in the cell is defined as an erase state (logic value "1"), and a state that a current does not flow in the cell is defined as a program state (logic value "0"), respectively.

When the data buffer 104 is initialized as "0", the controller 106 searches the redundancy control unit 105, thereby checking whether the redundancy replacement occurs. The column address of the main area 10 which is replaced by the redundancy is stored in the redundancy control unit 105.

When the redundancy replacement occurs, the controller 106 loads the redundancy information which is stored in the redundancy control unit 105 to the data buffer 104(202). That is, the cell in the memory cell array 101 is positioned identically to the SRAM cell in the data buffer 104, and thus the logic value of the cell "1" is stored in the SRAM cell designated by the column address read in the redundancy control unit 105. This operation is repeatedly carried out until the controller 106 completely searches the redundancy information stored in the redundancy control unit 105. Accordingly, when the operation is finished, the logic value "1" is stored in the cell of the data buffer 104 positioned identically to the column replaced by the redundancy in the data buffer 104, and the logic value "0" is stored in the cell which is not replaced.

When the loading operation of the data buffer 104 is finished, the wordline circuit 107 selects an erase block from the memory cell array 101, applies the erase pulse to the erase block, and erases all the cells, under the control of the controller 106(203). Here, the erase block includes the main area 10 and the redundant area 12 which are simultaneously erased by the erase pulse.

(2) Erase Verifying Operation

When the erase operation is finished, the controller 106 initializes the erase verifying condition(204).

That is, the controller 106 controls the wordline circuit 107 and applies a certain wordline voltage (erase verifying voltage) to the wordline in the selected erase block, and controls the column selector 102 and sequentially selects the columns in the main area 10. As a result, the cells in the memory cell array 101 are sequentially selected by the wordline voltage outputted from the wordline circuit 107 and the column address outputted from the column selector 102, and thus the logic value of the SRAM cell in the data buffer which is positioned identically to the currently-selected cell is inputted to the controller 106.

Accordingly, whenever the column address is increased, the controller 106 checks whether the information ouputted from the data buffer 104 is "1"(205). When the logic value is "1", the controller 106 determines that the currentlyverified cell is erased. In the case that the column is not the last one, the controller 106 increases the columns and repeatedly performs the above operation(208) because it implies that the column including the currently-verified cell is replaced by the redundancy.

On the other hand, when the logic value is "0", the controller 106 checks the output from the sense amplifier 103(206)(207). Here, when the output from the sense amplifier 103 is "1", the controller 106 recognizes that the selected cell is erased. In the case that the output from the sense amplifier 103 is "0", the controller 106 determines that the selected cell is not completely erased.

Then, when the erase verifying operation of the cell selected by the last column is finished(208), whenever each cell is verified, the controller 106 ignores a result of verifying the replaced cell, and checks a result of verifying the normal cell according to the replacement information inputted from the data buffer 104. When the outputs from the sense amplifier 103 are all "1", the controller 106 externally outputs the logic value "1" displaying that the selected erase blocks are all normally erased, and finishes the erase operation(209). However, in the case that the outputs from the sense amplifier 103 are "0" in one or more cells, the controller 106 controls the wordline circuit 107, erases the cells which are not erased, and repeatedly performs the erase verifying operation until the cells in the selected erase block are all erased.

According to another embodiment of the present invention, a logic ORing the output from the data buffer 104 and the output from the sense amplifier 103 is further included. The output from the logic is inputted to the controller 106, and thus the steps in FIG. 2 (205)(207) is combined.

As discussed earlier, according to the present invention, the erase verifying operation can be exactly carried out on the normal cells by using the output from the sense amplifier and on the cells which are replaced by the redundancies by using the data buffer.

In addition, according to the present invention, the erase verifying operation is performed by the software method on the basis of the information of the cell replaced by the redundancy inputted from the data buffer. Therefore, the erase verifying operation can be carried out with a minimum hardware, regardless of a number of the sense amplifiers and a volume of the redundancy.

As the present invention may be embodied in several forms without departing from the spirit of essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. An erase verifying apparatus comprising:
   a memory cell array including a plurality of main areas and redundant areas having one or more cells, the main areas and redundant areas forming an erase block;
   a wordline circuit for selecting a wordline and erasing the selected wordline;
   a redundancy control unit for storing redundancy information;
   a data buffer for storing replacement information in the cell based on the redundancy information outputted from the redundancy control unit;
   a column selector for sequentially selecting a plurality of columns;
   a sense amplifier for sensing an output from the cell selected by the column selector; and
   a controller for controlling all the operations and carrying out the erase verifying operation.

2. The apparatus of claim 1, wherein the data buffer consists of a static RAM (SRAM).

3. The apparatus of claim 1, wherein the data buffer consists of a register.

4. The apparatus of claim 1, wherein the redundancy information is an address of the replaced column, the column of the data buffer is identically positioned to the column and cell of the memory cell array, and the replacement information is stored in the cell of the data buffer which is designated by the redundancy information.

5. The apparatus of claim 4, wherein a logic value of the replacement information stored in the data buffer is an inverted form of an initial logic value, and the data buffer outputs the replacement information to the controller whenever the cell is selected by the column selector.

6. The apparatus of claim 1, wherein the controller receives the replacement information of the cell positioned identically to a currently-verified cell from the data buffer, and recognizes that the selected cell is erased when there is a redundancy replacement, and carries out the erase verifying operation again by detecting the output of the sense amplifier when there is no redundancy replacement.

7. The apparatus of claim 6, wherein the controller recognizes that the selected cell is erased when the output of the sense amplifier is "1".

8. The apparatus of claim 1, wherein the controller controls the wordline circuit and erases a currently-selected cell when the cell is not replaced by the redundancy and not erased, and carries out the erase verifying operation again from the erased cell.

9. In a flash memory with redundancy which includes an NOR type cell array, the cell array being divided into a plurality of main areas and redundant areas including one or more cells, the main areas and redundant areas forming an erase block, an erase verifying apparatus comprising:
   a controller for controlling all operations;
   a wordline circuit for controlling a wordline of the serial flash memory;
   a redundancy control unit for storing redundancy information;
   a data buffer for loading the redundancy information from the redundancy control unit;
   a column selector for selecting a column of the serial flash memory;
   a sense amplifier for sensing an output of the selected cell; and
   a logic unit for operating the outputs of the data buffer and sense amplifier.

10. The apparatus of claim 9, wherein the data buffer consists of a static RAM or register.

11. The apparatus of claim 9, wherein the redundancy information is an address of the replaced column in the main area, a loading operation of the redundancy information sets a logic value oppositely to the initial value in the cell of the data buffer which is designated by the column address, and the memory cell of the data buffer is positioned identically to the flash memory cell.

12. The apparatus of claim 9, wherein the wordline circuit selects and erases the erase block under the control of the controller, and applies an erase verifying voltage to the wordline of the erase block during the erase verifying operation.

13. The apparatus of claim 9, wherein the data buffer stores the replacement information in the cell designated by the redundancy information, and the replacement information is an inverted form of the initial logic value.

14. The apparatus of claim 13, wherein the data buffer outputs the replacement information stored in the cell to the controller whenever the column is selected by the column selector.

15. The apparatus of claim 9, wherein the controller recognizes that the cell is erased when the logic value outputted from the logic unit is "1", and controls the wordline circuit, erases the cell and carries out the erase verifying operation from the erased cell when the logic value is "0".

16. In a flash memory with redundancy which includes an NOR type memory cell array, the memory cell array being divided into a plurality of main areas and redundant areas including one or more cells, the main areas and redundant areas forming an erase block, an erase verifying method comprising the steps of:

initializing the data buffer;

loading redundancy information stored in the redundancy control unit to the data buffer;

selecting a certain erase block and erasing the cell data from the selected erase block by using the wordline circuit;

sequentially selecting the cells of the selected erase block;

checking whether the cell of the data buffer corresponding to the selected cell is replaced by the redundancy; and checking the output from the sense amplifier when the cell of the data buffer is not replaced by the redundancy.

17. The method of claim 16, wherein the redundancy information is an address of the replaced column in the main area, the cell of the data buffer is positioned identically to the cell of the memory cell array.

18. The method of claim 16, wherein the redundancy information is loaded by setting a logic value oppositely to the initial value in the cell of the data buffer which is designated by the column address.

19. The method of claim 16, wherein the cell is determined as being replaced by the redundancy when the logic value is outputted from the data buffer, and the cell is determined as being erased when the cell is replaced by the redundancy or the output of the sense amplifier is "1".

20. The method of claim 16, further comprising a step of erasing a currently-selected cell by controlling the wordline circuit and carrying out the erase verifying operation again from the erased cell when the cell is not replaced by the redundancy and not erased.

* * * * *